United States Patent
Tseng et al.

(10) Patent No.: US 12,374,398 B2
(45) Date of Patent: Jul. 29, 2025

(54) FORMING OPERATION OF RESISTIVE MEMORY DEVICE

(71) Applicant: Winbond Electronics Corp., Taichung (TW)

(72) Inventors: I-Hsien Tseng, Taichung (TW);
Lung-Chi Cheng, Taichung (TW);
Ju-Chieh Cheng, Taichung (TW);
Jun-Yao Huang, Hsinchu (TW);
Ping-Kun Wang, Changhua County (TW)

(73) Assignee: Winbond Electronics Corp., Taichung (TW)

( * ) Notice: Subject to any disclaimer, the term of this patent is extended or adjusted under 35 U.S.C. 154(b) by 174 days.

(21) Appl. No.: 18/457,377

(22) Filed: Aug. 29, 2023

(65) Prior Publication Data

US 2024/0087644 A1    Mar. 14, 2024

(30) Foreign Application Priority Data

Sep. 14, 2022 (TW) .................................. 111134788

(51) Int. Cl.
*G11C 13/00* (2006.01)

(52) U.S. Cl.
CPC ...... *G11C 13/0069* (2013.01); *G11C 13/0007* (2013.01); *G11C 2013/0083* (2013.01)

(58) Field of Classification Search
None
See application file for complete search history.

(56) References Cited

U.S. PATENT DOCUMENTS

2011/0205782 A1    8/2011   Costa et al.

FOREIGN PATENT DOCUMENTS

CN           110088836        6/2023

OTHER PUBLICATIONS

"Office Action of Taiwan Counterpart Application", issued on Mar. 27, 2024, p. 1-p. 7.

*Primary Examiner* — Alfredo Bermudez Lozada
(74) *Attorney, Agent, or Firm* — JCIPRNET

(57) ABSTRACT

A forming operation of resistive memory device is provided. The operation includes: applying a pre-forming gate voltage and a pre-forming bit line voltage to a target memory cell; performing a dense switching forming operation, wherein the dense switching forming operation includes alternately performing dense set operations and dense reset operations on the target memory cell, wherein the dense set operation includes applying a dense switching gate voltage and a dense set bit line voltage; and performing a normal set operation on the target memory cell, wherein the normal set operation includes applying a normal set gate voltage and a normal set bit line voltage to the target memory cell, the normal set gate voltage is greater than the pre-forming gate voltage and the dense switching gate voltage, and the normal set bit line voltage is less than the pre-forming bit line voltage and the dense set bit line voltage.

19 Claims, 4 Drawing Sheets

FORMING OPERATION OF RESISTIVE MEMORY DEVICE

CROSS-REFERENCE TO RELATED APPLICATION

This application claims the priority benefit of Taiwan application Ser. No. 111134788, filed on Sep. 14, 2022. The entirety of the above-mentioned patent application is hereby incorporated by reference herein and made a part of this specification.

BACKGROUND

Technical Field

The disclosure relates to a memory device, and in particular relates to a forming operation of a resistive memory device that avoids the occurrence of over-forming.

Description of Related Art

Resistive memory (e.g., resistive random access memory (RRAM)) may change the resistance value by forming and changing the width of the conductive filamentary (CF) path to store data of different logic levels. Generally speaking, in the process of manufacturing a resistive memory, a forming operation, which is much stronger than a general set operation, needs to be used to pull out oxygen ions in the transition metal oxide to produce conductive filaments, and turn the resistive memory into a low resistance state (LRS). Next, immediately after the forming operation is completed, an initial reset operation with an intensity equivalent to the forming operation but with a different polarity is performed to reset most of the oxygen ions to block the conductive filaments and turn the resistive memory into a high resistance state (HRS).

However, the forming operation may cause the following two situations: (1) the multi-conductive filaments phenomenon and (2) the ionization of excess oxygen ions near electron holes. The multi-conductive filaments phenomenon generally refers to the situation where the conductive filament paths are too wide and the density is low due to over-forming. When the multi-conductive filaments phenomenon occurs, the conductive filaments are easily degraded during the high temperature data retention (HTDR) test, so that the RRAM cannot turn into an LRS. In addition, as the number of operations increases, the asymmetry between the set operation and the reset operation becomes more and more severe, resulting in the generation of tailing bits.

In addition, the aforementioned ionization of excess oxygen ions near electron holes causes the oxygen ions to be backfilled into the oxygen vacancies of the conductive filaments from the heat provided during the HTDR test, so that the RRAM cannot turn into an LRS. In addition, if the aforementioned ionization of excess oxygen ions near electron holes occurs, with the increase of the number of operations, it is easy to cause the current after the set operation to decrease, and even cause the situation where LRS is switched to HRS (also referred to as set complementary switching).

SUMMARY

The disclosure provides a forming operation of a resistive memory device, which may avoid the generation of multi-conductive filaments and the ionization of oxygen ions caused by the forming operation.

The forming operation of a resistive memory device of the disclosure includes the following operation. A pre-forming operation is performed on a target memory cell. The pre-forming operation includes applying a pre-forming gate voltage and a pre-forming bit line voltage to the target memory cell. After the pre-forming operation, a dense switching forming operation is performed on the target memory cell. The dense switching forming operation includes alternately performing a dense set operation and a dense reset operation on the target memory cell. The dense set operation includes applying a dense switching gate voltage and a dense set bit line voltage to the target memory cell. After the dense switching forming operation, a normal set operation is performed on the target memory cell. The normal set operation includes applying a normal set gate voltage and a normal set bit line voltage to the target memory cell. The normal set gate voltage is greater than the pre-forming gate voltage and the dense switching gate voltage, and the normal set bit line voltage is less than the pre-forming bit line voltage and the dense set bit line voltage.

Based on the above, the forming operation of a resistive memory device of the disclosure may improve the forming operation, and avoid the generation of multi-conductive filaments and the ionization of excess oxygen ions near electron holes. In this way, the chances of over-forming, over-setting and set-complementary switching may be effectively reduced, and at the same time, the time for executing the forming operation may be reduced, and the production efficiency may be improved.

DETAILED DESCRIPTION OF DISCLOSED EMBODIMENTS

Figure 1:
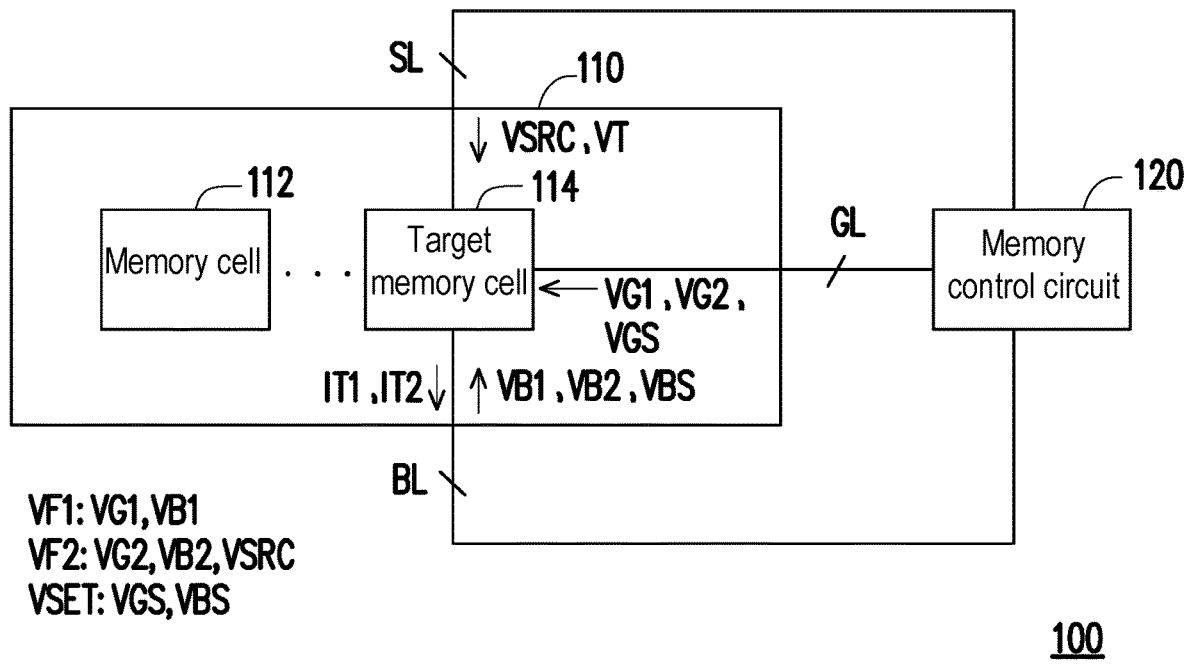
FIG. 1 is a schematic diagram of a resistive memory device of an embodiment of the disclosure.
Figure 2:
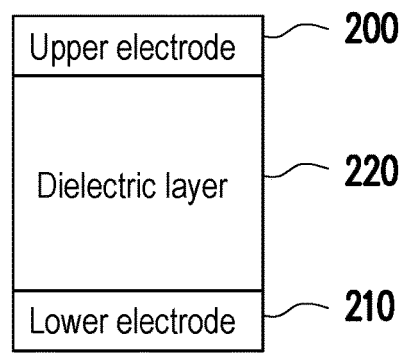
FIG. 2 is a schematic diagram of a memory cell of an embodiment of the disclosure.

Referring to FIG. 1, a resistive memory device 100 includes a memory cell array 110 and a memory control circuit 120. The memory cell array 110 includes multiple memory cells 112. Each memory cell 112 is coupled to a corresponding gate line GL, source line SL, and bit line BL, and by selecting the gate line GL, the source line SL, and the bit line BL through a command specified by the memory control circuit 120, at least one target memory cell 114 may be selected from the memory cells 112 to perform a specified operation (e.g., form, set, or reset, etc.). To simplify the drawings, only two memory cells are shown in FIG. 1 as a representative. As shown in FIG. 2, the memory cell 112 includes, for example, an upper electrode 200, a lower electrode 210, and a dielectric layer 220. The upper electrode 200 and the lower electrode 210 include good metal conductors, and the materials of the two may be the same or different. The dielectric layer 220 is disposed between the upper electrode 200 and the lower electrode 210. The dielectric layer 220 includes a dielectric material, for example, including transition metal oxides. The memory cell 112 may have at least two resistance states to provide the function of storing data.

The memory control circuit 120 is coupled to multiple gate lines GL, multiple source lines SL, and multiple bit lines BL of the memory cell array 110. The memory control circuit 120 is, for example, a central processing unit, or other programmable general-purpose or special-purpose microprocessor, a digital signal processor, a programmable controller, an application specific integrated circuit, a programmable logic device, or other similar devices or a combination of the devices thereof. It may also be a hardware circuit designed through a hardware description language or any other digital circuit design methods well known to those skilled in the art and realized through methods such as the field programmable logic gate array or complex programmable logic device. In addition, although FIG. 1 shows that the memory control circuit 120 is located in the resistive memory device 100, the memory control circuit 120 may also be a device independent of the resistive memory device 100, such as a control circuit in a wafer testing device.

Figure 3:
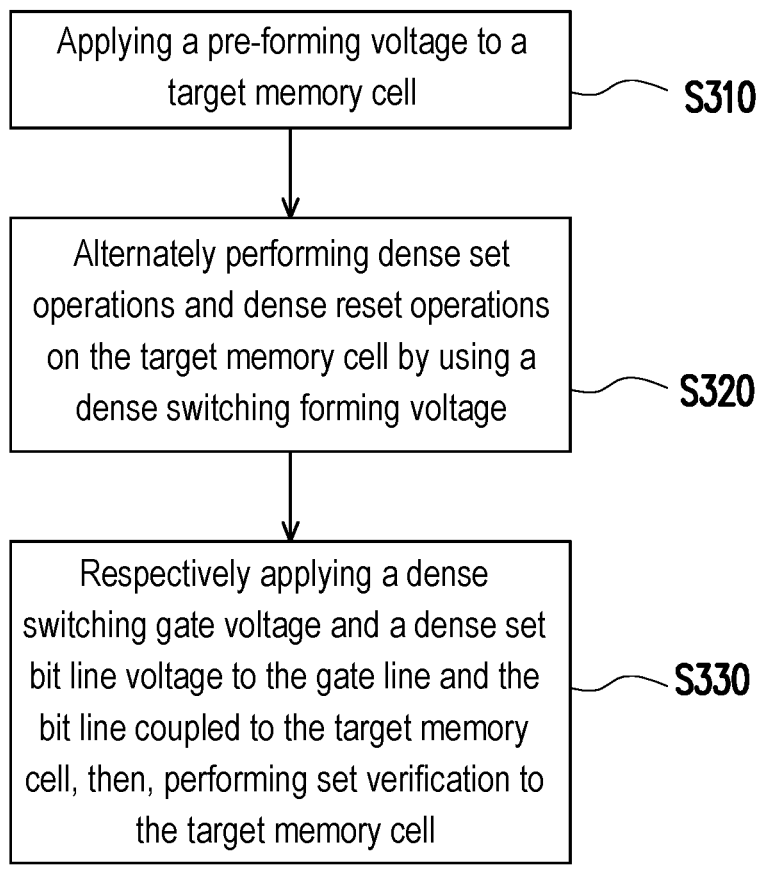
FIG. 3 is a flowchart of the steps of a forming operation of a resistive memory device of an embodiment of the disclosure.

Referring to FIG. 1 and FIG. 3 at the same time, the forming operation of the resistive memory device of this embodiment is applicable to the resistive memory device 100 of FIG. 1. The forming operation of a resistive memory device in this embodiment includes a pre-forming operation S310, a dense switching forming operation S320, and a normal set operation S330 performed in sequence.

The pre-forming operation S310 of the embodiment is configured so that the current flowing out of the target memory cell 114 is greater than 0 and less than the fast bit elimination threshold IRL In the pre-forming operation S310 of this embodiment, the memory control circuit 120 applies the pre-forming voltage VF1 to the target memory cell 114. Specifically, the pre-forming voltage VF1 includes a pre-forming gate voltage VG1 and a pre-forming bit line voltage VB1. The memory control circuit 120 may respectively apply the pre-forming gate voltage VG1 and the pre-forming bit line voltage VB1 to the gate line GL and the bit line BL coupled to the target memory cell 114. In one embodiment, the pre-forming verification threshold is configured to be less than the normal set verification threshold. The pulse width of the pre-forming voltage VF1 (e.g., the pre-forming gate voltage VG1) is greater than N times the pulse width of the normal set voltage VSET (e.g., the normal set gate voltage VGS), where N is a positive integer greater than 1. Through the pre-forming operation S310 of this embodiment, the multi-conductive filaments phenomenon may be avoided and oxygen ions being pulled into the upper electrode 200 may be ensured. The number of pulses of the pre-forming voltage VF1 is, for example, 1, that is, a single pre-forming gate voltage VG1 and a single pre-forming bit line voltage VB1. In one embodiment, the initial reset operation is not performed between the pre-forming operation S310 and the dense switching forming operation S320, thereby reducing the forming time of the resistive memory device 100.

Next, the memory control circuit 120 performs the dense switching forming operation S320 on the target memory cell 114, and the dense switching forming operation S320 in this embodiment is configured to increase the strength of the conductive filament. In the dense switching forming operation 5320, the dense set operation and the dense reset operation are alternately performed on the target memory cell 114 using the dense switching forming voltage VF2. Specifically, the dense switching forming voltage VF2 includes the dense switching gate voltage VG2, the dense set bit line voltage VB2, and the dense reset source voltage VSRC. The memory control circuit 120 may apply the dense switching gate voltage VG2 to the gate line GL coupled to the target memory cell 114 during the dense switching forming operation, apply the dense set bit line voltage VB2 to the bit line BL coupled to the target memory cell 114 during the dense set operation, and apply the dense reset source voltage VSRC to the source line SL coupled to the target memory cell 114 during the dense reset operation. In this embodiment, the dense set operation is followed by the dense reset operation. One dense set operation and one dense reset operation are referred to as one dense switching cycle, and the number of dense switching cycles may, for example, be greater than 20 times, but the disclosure is not limited thereto. In another embodiment, the pulse width of the pre-forming gate voltage VG1 is greater than X times the pulse width of the normal set gate voltage VGS, and the number of dense switching cycles is greater than or equal to X times.

Next, in the normal set operation 5330, the memory control circuit 120 applies the normal set voltage VSET to the target memory cell 114. The normal set operation 5330 in this embodiment is configured so that the current flowing from the target memory cell 114 is greater than the normal set verification threshold IR2, thereby checking whether the previous pre-forming operation 5310 is correctly executed. Specifically, the normal set voltage VSET includes the normal set gate voltage VGS and the normal set bit line voltage VBS. The memory control circuit 120 may respectively apply the normal set gate voltage VGS and the normal set bit line voltage VBS to the gate line GL and the bit line BL coupled to the target memory cell 114. Afterwards, the memory control circuit 120 performs set verification on the target memory cell 114 to determine whether the current flowing from the target memory cell 114 is greater than the normal set verification threshold. When the current flowing from the target memory cell 114 is not greater than the normal set verification threshold, the pre-forming bit line voltage VB1 is increased, and the process returns to the pre-forming operation S310 to apply the increased pre-forming bit line voltage VB1 to the target memory cell 114.

Figure 5:
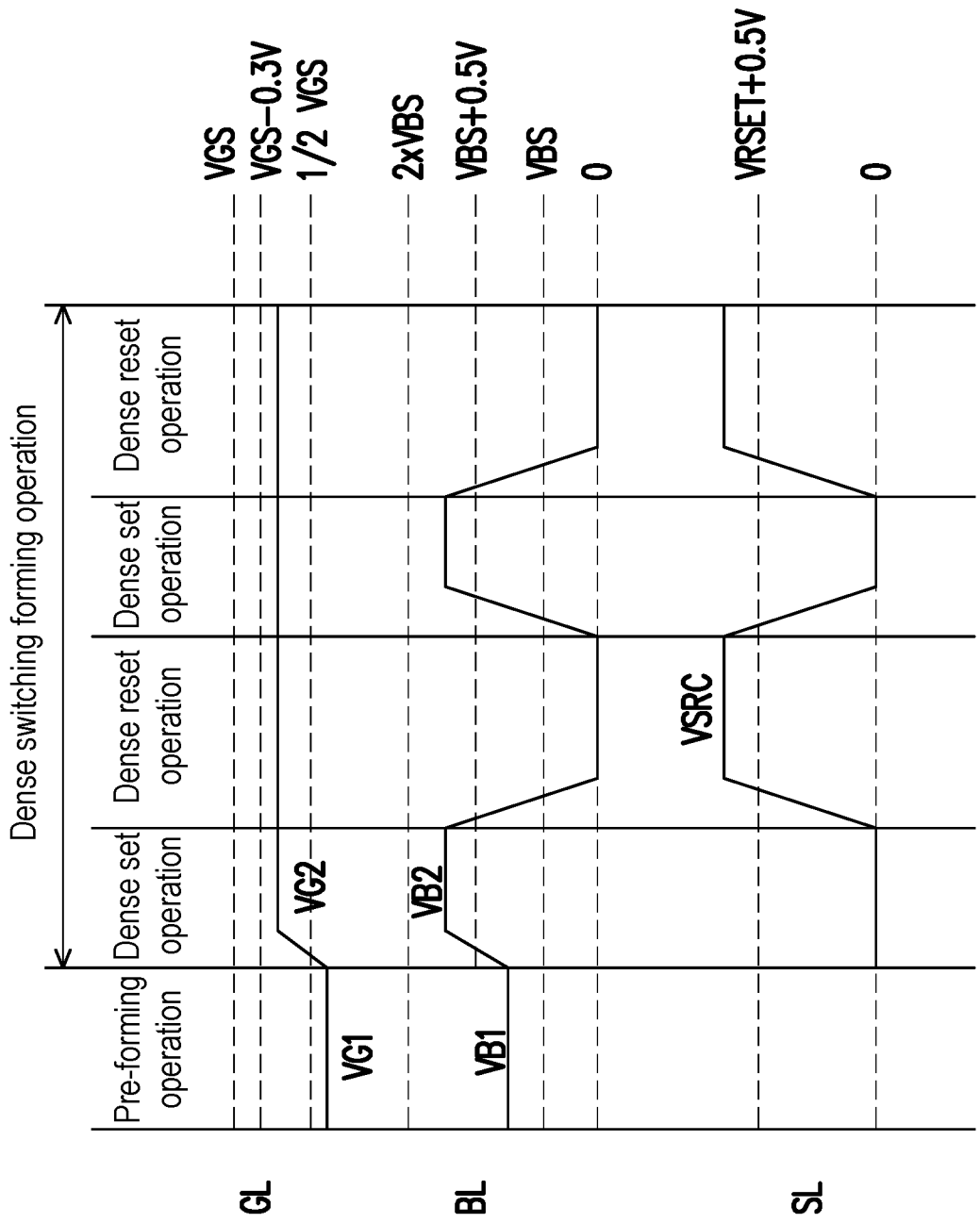
FIG. 5 is a waveform schematic diagram of various voltages in a pre-forming operation and a dense switching forming operation of a forming operation of a resistive memory device of an embodiment of the disclosure.

FIG. 5 is a waveform schematic diagram of various voltages applied to the gate line GL, the bit line BL, and the source line SL during the pre-forming operation and the dense switching forming operation. As shown in FIG. 5, in these voltage configurations, the dense switching gate voltage VG2 is less than the normal set gate voltage VGS, and the dense switching gate voltage VG2 is greater than the pre-forming gate voltage VG1. In this way, the transition metal oxide may be prevented from being damaged during the dense switching forming operation (e.g., the phenomenon of over-setting occurs), and the stability of the conductive filament may be improved. In this embodiment, the pre-forming gate voltage VG1 is, for example, less than half of the normal set gate voltage VGS, and the dense switching gate voltage VG2 is less than the normal set gate voltage VGS minus 0.3 volts. The normal set gate voltage VGS is, for example, 2.5 volts, but the disclosure is not limited thereto.

In this embodiment, the pre-forming bit line voltage VB1 is greater than the normal set bit line voltage VBS and less than twice the normal set bit line voltage VBS. The absolute value of the dense set bit line voltage VB2 is greater than the absolute value of the normal set bit line voltage VBS plus 0.5 volts. The absolute value of the dense reset source voltage VSRC is greater than the absolute value of the normal reset source voltage VRSET of the normal reset operation plus 0.5 volts. In this way, the stability of the conductive filament may be improved and the load of the bit line BL or the source line SL may be reduced. In addition, the normal set bit line voltage VBS is, for example, 2.5 volts, but the disclosure is not limited thereto.

In the configuration of the voltage pulses, the pulse width of the normal set voltage VSET is set to, for example, 100 nanoseconds, and this value is not used to limit the disclosure. For example, the pulse width of the pre-forming voltage VF1 (e.g., the pre-forming gate voltage VG1) is greater than 20 times the pulse width of the normal set voltage VSET (e.g., the normal set gate voltage VGS), and the pulse width of the dense switching forming voltage VF2 (e.g., the dense set bit line voltage VB2) is equal to the pulse width of the normal set voltage VSET (e.g., the normal set bit line voltage VBS). It is particularly noted that, in order to simplify the drawing, FIG. 5 does not show the corresponding relationship and multiple with respect to the pulse width.

Through the aforementioned forming operation of the resistive memory device, stronger conductive filaments may be created during the forming process of the resistive memory device, so as to avoid the multi-conductive filaments phenomenon and the ionization of excess oxygen ions near electron holes. At the same time, the conventionally required initial reset operation may be omitted in the forming operation of the disclosure, so the time for executing the forming operation may be reduced, thereby improving the production efficiency.

Figure 4:
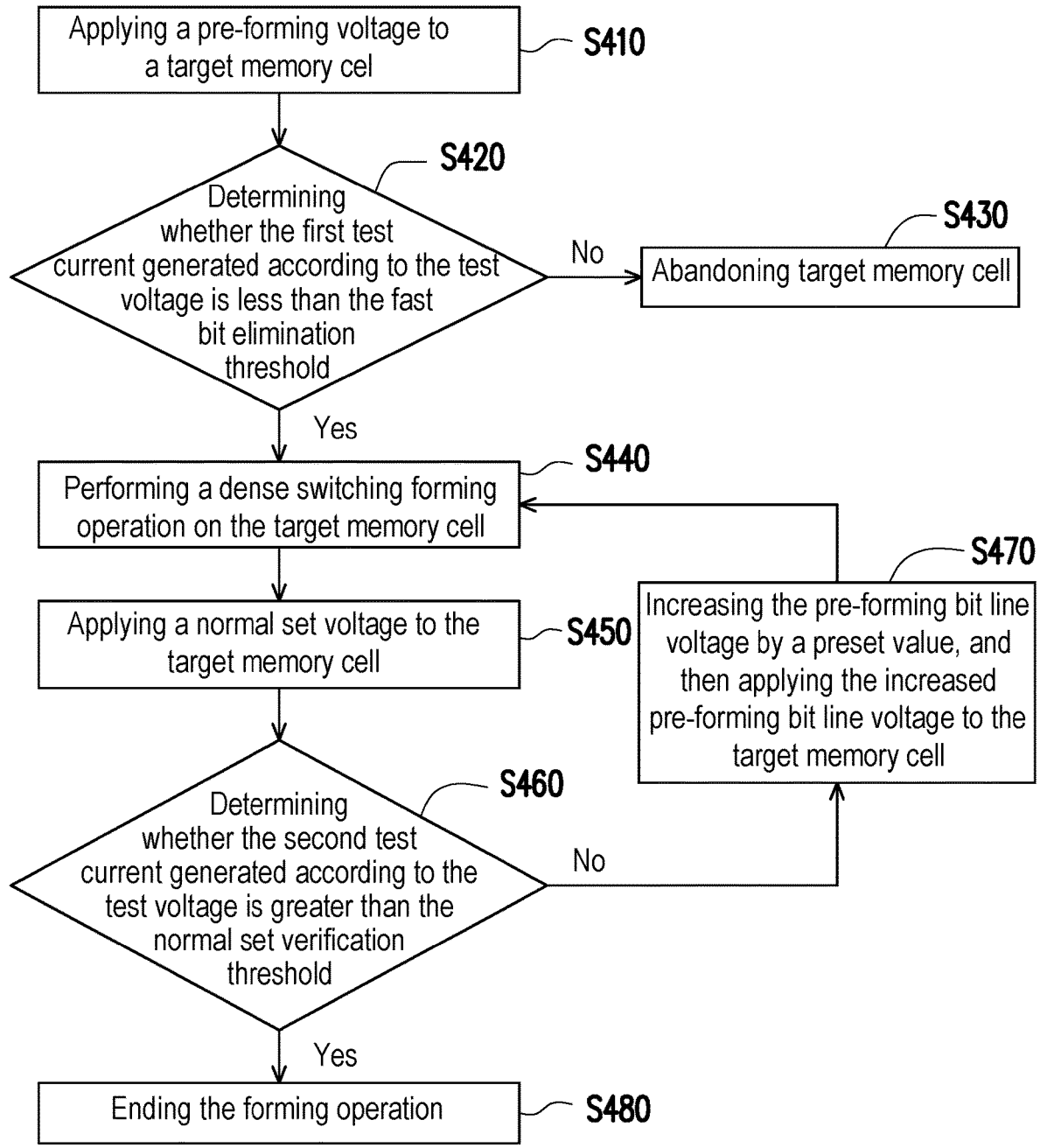
FIG. 4 is a flowchart of the steps of a forming operation of a resistive memory device of another embodiment of the disclosure.

Referring to FIG. 1 and FIG. 4 at the same time, the forming operation of the resistive memory device of another embodiment of the present embodiment is applicable to the resistive memory device 100 of FIG. 1. In this embodiment, the same or similar reference symbols are used to represent the same or similar technical terms, and those skilled in the art should know that, without departing from the spirit of this embodiment, the relevant implementation details and examples of the same or similar technical terms described in the foregoing embodiments should be equally applicable to this embodiment, but descriptions are not repeated in this embodiment.

In this embodiment, the pre-forming operation includes step S410 and step S420. In step S410, the memory control circuit 120 applies the pre-forming voltage VF1 to the target memory cell 114. Specifically, the memory control circuit 120 may respectively apply the pre-forming gate voltage VG1 and the pre-forming bit line voltage VB1 to the gate line GL and the bit line BL coupled to the target memory cell 114.

After applying the pre-forming voltage VF1, in step S420, the memory control circuit 120 determines whether the first test current IT1 generated according to the test voltage VT is less than the fast bit elimination threshold IR1. For example, the memory control circuit 120 may apply the test voltage VT to the source line SL coupled to the target memory cell 114, and may determine whether the first test current IT1 generated by the bit line BL coupled to the target memory cell 114 is less than the fast bit elimination threshold IR1. The test voltage VT is configured to obtain the current state (i.e., the test current) of the target memory cell 114, which is much smaller than the pre-forming voltage VF1, the dense switching forming voltage VF2, and the normal set voltage VSET without affecting the resistance state of the resistive memory device 100.

If the memory control circuit 120 determines that the first test current IT1 is not less than the fast bit elimination threshold IR1, as shown in step S430, the memory control circuit 120 may regard the target memory cell 114 as fail, and then discard the target memory cell 114. In one embodiment, in step S420, the memory control circuit 120 determines whether the first test current IT1 of all the bits in a die is less than the fast bit elimination threshold IR1, if the first test current IT1 of any one bit in the die is not less than the fast bit elimination threshold IR1, the die is eliminated. Through step S420, the memory control circuit 120 may determine whether there is a fast bit, and may eliminate the die with the fast bit in step S430, so as to obtain a die with more concentrated current distribution in the low resistance state, thereby improving the reliability after many cycles.

If the memory control circuit 120 determines that the first test current IT1 is less than the fast bit elimination threshold IR1, as shown in step S440, the memory control circuit 120 may perform a dense switching forming operation on the target memory cell 114. The detailed description of the dense switching forming operation has been described in the aforementioned embodiments, and thus are not repeated herein.

After the dense switching forming operation, the memory control circuit 120 executes a normal set operation on the target memory cell 114. In this embodiment, the normal set operation includes step S450 and step S460. In step S450, the memory control circuit 120 applies the normal set voltage VSET to the target memory cell 114. Specifically, the memory control circuit 120 may respectively apply the normal set gate voltage VGS and the normal set bit line voltage VBS to the gate line GL and the bit line BL coupled to the target memory cell 114.

After applying the normal set voltage VSET to the target memory cell 114, as shown in step S460, the memory control circuit 120 determines whether the second test current IT2 generated according to the test voltage VT is greater than the normal set verification threshold IR2. For example, the memory control circuit 120 may apply the test voltage VT to the source line SL coupled to the target memory cell 114, and may determine whether the second test current IT2 generated by the bit line BL coupled to the target memory cell 114 is greater than the normal set verification threshold IR2. In this embodiment, the normal set verification threshold IR2 is greater than 1.5 times the fast bit elimination threshold IR1. In one embodiment, the fast bit elimination threshold IR1 is, for example, 10 to 20 microamperes.

If the memory control circuit 120 determines that the second test current IT2 is not greater than the normal set verification threshold IR2, it means that the pre-forming bit line voltage VB1 in the previous pre-forming operation is not high enough. As shown in step S470, the memory control circuit 120 controls a related circuit (e.g., a booster circuit) to increase the pre-forming bit line voltage VB1 by a predetermined value, then applies the increased pre-forming bit line voltage VB1 to the target memory cell 114, and returns to step S440. The aforementioned predetermined value is, for example, 0.2 volts. In this way, for the same bit, as the number of pre-forming operations increases, the pre-forming bit line voltage VB1 increases stepwise, so as to effectively perform pre-forming and avoid over-forming.

If the memory control circuit 120 determines that the second test current IT2 is greater than the normal set verification threshold IR2, in step S480, the forming operation of this embodiment ends. In other words, the forming operation of the target memory cell 114 has been completed, and for example, the process of the next stage of chip probing (CP) may be performed.

To sum up, according to the forming operation of a resistive memory device of the disclosure, strong conductive filaments (e.g., increasing the density of the conductive filaments) may be produced during the forming process of the resistive memory device by the pre-forming operation and the dense switching forming operation. In this way, the chances of over-forming, over-setting and set-complementary switching may be effectively reduced, and at the same time, the time for executing the forming operation may be reduced, and the production efficiency may be improved.

Besides, since production efficiency and reliability of the resistive memory device of the present invention are improved, the present invention provides a sustainable resistive memory device.

Although the present invention has been disclosed as above with the embodiments, but the embodiments are not intended to limit the present invention. Any one of ordinary skill in the art can make some changes and refinements without departing from the spirit and scope of the present invention. Therefore, the protection scope of the present invention shall be defined by the scope of the appended claims.

What is claimed is:

1. A forming operation of a resistive memory device, comprising:
   performing a pre-forming operation on a target memory cell, wherein the pre-forming operation comprises applying a pre-forming gate voltage and a pre-forming bit line voltage to the target memory cell;
   after the pre-forming operation, performing a dense switching forming operation on the target memory cell, wherein the dense switching forming operation comprises alternately performing a dense set operation and a dense reset operation on the target memory cell, wherein the dense set operation comprises applying a dense switching gate voltage and a dense set bit line voltage to the target memory cell; and
   after the dense switching forming operation, performing a normal set operation on the target memory cell, wherein the normal set operation comprises applying a normal set gate voltage and a normal set bit line voltage to the target memory cell, wherein the normal set gate voltage is greater than the pre-forming gate voltage and the dense switching gate voltage, and the normal set bit line voltage is less than the pre-forming bit line voltage and the dense set bit line voltage.

2. The forming operation of the resistive memory device according to claim 1, wherein the pre-forming operation further comprises:
   after applying the pre-forming gate voltage and the pre-forming bit line voltage to the target memory cell, determining whether a first test current is less than a fast bit elimination threshold,
   wherein when the first test current is less than the fast bit elimination threshold, the dense switching forming operation is performed on the target memory cell.

3. The forming operation of the resistive memory device according to claim 2, wherein the normal set operation further comprises:
   after applying a normal set gate voltage and a normal set bit line voltage to the target memory cell, determining whether the second test current is greater than a normal set verification threshold, wherein the normal the normal set verification threshold is greater than the fast bit elimination threshold; and
   when the second test current is greater than the normal set verification threshold, ending the forming operation.

4. The forming operation of the resistive memory device according to claim 3, wherein the normal set verification threshold is greater than 1.5 times the fast bit elimination threshold.

5. The forming operation of the resistive memory device according to claim 3, when the second test current is not greater than the normal set verification threshold, increasing the pre-forming bit line voltage by a predetermined value, then applying the pre-forming bit line voltage that has been increased by the predetermined value to the target memory cell.

6. The forming operation of the resistive memory device according to claim 5, after applying the pre-forming bit line voltage that has been increased by the predetermined value to the target memory cell, performing the dense switching forming operation on the target memory cell once again.

7. The forming operation of the resistive memory device according to claim 2, further comprising: when the first test current is not less than the fast bit elimination threshold, determining the target memory cell as fail, wherein the test current is configured to be less than the pre-forming gate voltage.

8. The forming operation of the resistive memory device according to claim 2, further comprising determining whether the first test current of all bits in a die is less than the fast bit elimination threshold, wherein if the first test current of any one bit in the die is not less than the fast bit elimination threshold, the die is eliminated.

9. The forming operation of the resistive memory device according to claim 2, wherein the fast bit elimination threshold is 10 to 20 microamperes.

10. The forming operation of the resistive memory device according to claim 1, wherein the pre-forming bit line voltage applied to the target memory cell increases as a number of pre-forming operation increases.

11. The forming operation of the resistive memory device according to claim 1, wherein the pre-forming gate voltage is less than half of the normal set gate voltage.

12. The forming operation of the resistive memory device according to claim 1, wherein the pre-forming bit line voltage is greater than the normal set bit line voltage and less than twice the normal set bit line voltage.

13. The forming operation of the resistive memory device according to claim 1, wherein the dense reset operation comprises applying the dense switching gate voltage and a dense reset source voltage to the target memory cell,
   wherein the dense switching gate voltage is greater than the pre-forming gate voltage, and an absolute value of the dense reset source voltage is greater than an absolute value of a normal reset source voltage of a normal reset operation.

14. The forming operation of the resistive memory device according to claim 13, wherein the dense switching gate voltage is less than the normal set gate voltage minus 0.3 volts, an absolute value of the dense set bit line voltage is greater than an absolute value of the normal set bit line voltage plus 0.5 volts, and the absolute value of the dense reset source voltage is greater than the absolute value of the normal reset source voltage plus 0.5 volts.

15. The forming operation of the resistive memory device according to claim 1, wherein a pulse width of the pre-forming gate voltage is greater than a pulse width of the normal set gate voltage.

16. The forming operation of the resistive memory device according to claim 15, wherein one dense set operation and one dense reset operation are referred to as one dense switching cycle, the pulse width of the pre-forming gate voltage is greater than X times the pulse width of the normal set gate voltage, and a number of the dense switching cycle is greater than or equal to X times.

17. The forming operation of the resistive memory device according to claim 1, wherein a pulse width of the pre-forming gate voltage is greater than 20 times a pulse width of the normal set gate voltage, and a pulse width of the dense set bit line voltage is equal to a pulse width of the normal set bit line voltage.

18. The forming operation of the resistive memory device according to claim 1, wherein an initial reset operation is not performed between the pre-forming operation and the dense switching forming operation.

19. The forming operation of the resistive memory device according to claim 1, wherein a pulse number of the pre-forming gate voltage is 1.

* * * * *